United States Patent
Kawasaki et al.

(10) Patent No.: US 7,326,626 B2
(45) Date of Patent: Feb. 5, 2008

(54) CAPACITOR AND METHOD FOR MANUFACTURING THE SAME

(75) Inventors: Yasuhiro Kawasaki, Osaka (JP); Kenji Yoneda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 168 days.

(21) Appl. No.: 11/138,497

(22) Filed: May 27, 2005

(65) Prior Publication Data

US 2005/0275007 A1 Dec. 15, 2005

(30) Foreign Application Priority Data

Jun. 10, 2004 (JP) ............................ P2004-172939

(51) Int. Cl.
*H01L 21/20* (2006.01)
(52) U.S. Cl. .................... 438/386; 438/243; 438/387
(58) Field of Classification Search ................ 438/239, 438/240, 243, 244, 386, 255, 387, 388, 396, 438/398
See application file for complete search history.

(56) References Cited

U.S. PATENT DOCUMENTS 6,057,189 A * 5/2000 Huang et al. ............... 438/253
7,029,985 B2 * 4/2006 Basceri et al. ............. 438/398
2003/0219941 A1 * 11/2003 Basceri et al. ............. 438/240
2003/0235968 A1 * 12/2003 Oh et al. .................... 438/396

FOREIGN PATENT DOCUMENTS

JP 5-204930 8/1993

* cited by examiner

*Primary Examiner*—Kevin M. Picardat
(74) *Attorney, Agent, or Firm*—McDermott Will & Emery LLP

(57) ABSTRACT

The capacitor of the present invention comprises: an opening part formed in an interlayer insulating film on a semiconductor substrate; a lower electrode made of a polycrystalline silicon with an uneven surface part; a chemical oxide film formed on the uneven surface part of the lower electrode; an silicon oxynitride film which is obtained by modifying the chemical oxide film by nitriding processing; a capacitive insulating film made of a metal oxide film formed on the silicon oxynitride film; and an upper electrode formed on the capacitive insulating film.

5 Claims, 17 Drawing Sheets

[ Formation of Cell Region ]

[ Deposition of Lower Electrode Amorphous Silicon ]

[ Formation of HSG-Si ]

[ Patterning of Lower Electrode ]

[ Formation of Upper Electrode ]

CAPACITOR AND METHOD FOR MANUFACTURING THE SAME

BACKGROUND OF THE INVENTION

1. Field of the Invention

The present invention relates to a capacitor used for storing the electrical charge of a memory cell and the like in a DRAM (Dynamic Random Access Memory), for example, and to a method for manufacturing the same.

2. Description of the Related Art

There is a type of capacitors as stacked capacitors whose capacitive insulating film is formed with tantalum oxide ($Ta_2O_5$) which exhibits a high dielectric constant and withstand voltage. Amorphous silicon is formed in an inner wall of an opening part of an interlayer insulating film. It is then made to be polycrystalline and conductive by a heat treatment thereby forming a lower electrode. A silicon nitride film (SiN) is formed on the surface of the polysilicon lower electrode. Furthermore, a capacitive insulating film of tantalum oxide is formed thereby forming an upper electrode of titanium nitride film (TiN).

In order to increase the effective electrode surface area for increasing the electrostatic capacity, an HSG (Hemi Spherical Grain) nucleus formed with a group of semispherical crystal grains is formed on the surface of the amorphous silicon. That is, the oxide film on the surface of the amorphous silicon as the base of the lower electrode is removed for forming the uneven surface. The more amorphous silicon is deposited on the uneven surface part by chemical vapor deposition (CVD) thereby forming the lower electrode. Then, it is cleaned with a chemical solution for removing the oxide film and forming the HSG (Hemi Spherical Grain) nucleus constituted of a group of semispherical grains. Then, a heat treatment is performed for forming HSG-Si. Subsequently, the silicon nitride film, the capacitive insulating film made of tantalum oxide, and upper electrode of the titanium nitride as described above are formed thereon.

There are following shortcomings in the capacitor made of tantalum oxide. Electric fields are locally concentrated in the particles or in the projected part of grain boundaries of HSG-Si, which are generated when forming HSG-Si, so that TDDB (Time Dependent Dielectric Breakdown) characteristic is deteriorated. Furthermore, with tantalum oxide, the potential barrier becomes small so that a large leak current is caused.

Further, in the process between the forming the lower electrode to the wiring, there may use reducing gas in hydrogen sintering (heat treatment) or when forming a film by $NH_3$ gas. The tantalum oxide film is reduced to metallic tantalum by the reducing gas and the TDDB characteristic is deteriorated.

Moreover, in the wiring step and the like after forming the upper electrode, plasma processing may be performed for forming an interlayer insulating film and a contact layer in contact. By the plasma processing, the tantalum oxide film is damaged and the TDDB characteristic is deteriorated.

BRIEF SUMMARY OF THE INVENTION

The capacitor of the present invention comprises:
 an opening part formed in an interlayer insulating film on a semiconductor substrate;
 a lower electrode made of a polycrystalline silicon with an uneven surface part, which is formed in an inner wall of the opening part;
 a chemical oxide film formed on the uneven surface part of the lower electrode;
 a silicon oxynitride film which is obtained by modifying the chemical oxide film by nitriding processing;
 a capacitive insulating film made of a metal oxide film formed on the silicon oxynitride film; and
 an upper electrode formed on the capacitive insulating film.

The chemical oxide film can be obtained by oxidizing the surface of the uneven surface part in the chemical solution.

With the configuration as described above, the chemical oxide film rounds the particle protrusion part or the boundary protrusion part of the uneven surface part thereby suppressing to cause the concentration of the electric field in the protrusion parts. Thus, it is possible to extend the life of the TDDB (Time Dependent Dielectric Breakdown) and to decrease the leak current.

In the above-described capacitor, it is preferable that the uneven surface part be HSG-Si which is constituted of a group of semispherical crystal grains, and that the metal oxide film of the capacitive insulating film be a tantalum oxide film.

Furthermore, in the above-described capacitor, it is preferable that the film thickness of the chemical oxide film be 0.5-1.5 nm. When the film thickness of the chemical oxide film is less than 0.5 nm, it is difficult to control the film thickness. When the film thickness of the chemical oxide film is larger than 2.0 nm, the capacitor comes to have the series structure of the oxide film and the metal oxide film thereby causing the deterioration of the capacity.

The first capacitor manufacturing method according to the present invention comprises the steps of:
 forming an opening part in an interlayer insulating film on a semiconductor substrate;
 forming a lower electrode made of polycrystalline silicon with an uneven surface part in an inner wall of the opening part;
 forming a chemical oxide film by oxidizing a surface of said lower electrode having the uneven surface part;
 modifying the chemical oxide film into a silicon oxynitride film by nitriding the surface of the uneven surface part of the lower electrode through the chemical oxide film;
 forming a capacitive insulating film made of a metal oxide film on the silicon oxynitride film; and
 forming an upper electrode on the capacitive insulating film.

In the configuration as described above, the chemical oxide film is formed on the surface of the uneven surface part of the lower electrode before forming the silicon oxynitride film. Thereby, the chemical oxide film rounds the particle protrusion part on the surface of the lower electrode or the boundary protrusion part of the uneven surface part. Thus, it is possible to suppress the concentration of the electric filed in the protrusion parts. As a result, it enables to suppress an increase in the leak current caused by the protrusion parts and the deterioration of the TDDB characteristic.

In the step of forming the chemical oxide film, the uneven surface part of the lower electrode is cleaned for exposing a silicon clean surface of the uneven surface part and, subsequently, a wet treatment is performed by a chemical liquid with oxidizing effect. Thereby, it enables to improve the efficiency of rounding the particle protrusion part or the boundary protrusion part of the uneven surface part by oxidation.

The second capacitor manufacturing method according to the present invention is the method where, in the step of forming the upper electrode of the first capacity manufacturing method, the titanium nitride film is formed as the upper electrode at the depositing temperature of 650° C.-700° C.

In the above-described configuration, the TiN film as the upper electrode is formed on the capacitive insulating film at 650° C.-700° C. Thereby, it is possible to better suppress the $NH_3$, which is the one of raw material for forming the TiN, from being taken into the TiN film compared to the case of forming it at relatively low temperatures of 550° C.-650° C. Thus, it has an effect of suppressing the reduction of the metal oxide film as the capacitive insulating film and of further improving the life time of the TDDB characteristic. When the temperature forming the film is lower than 650° C., the residual of $NH_3$ having the reduction effect in the film becomes excessive. In the meantime, when it is higher than 700° C., re-diffusion of dopant is caused so that the impurity profile may change thereby influencing the device characteristic.

In the above-described capacity manufacturing method, it is preferable to use hydrogen peroxide water, ozone water, or nitric acid as the chemical liquid with the oxidizing effect. Nitric acid has the highest oxidizing effect, then the ozone water, and the hydrogen peroxide water has the smallest. Thus, by selectively using the chemical liquid with the oxidizing effect, it is possible to improve the throughput and the yield.

In the above-described capacity manufacturing method, it is preferable to perform the step of forming the upper electrode after applying a heat treatment on the capacitive insulating film in an oxygen atmosphere. By supplying oxygen, the defect density of the capacitive insulating film is decreased.

Additional objects and advantages of the present invention will be apparent from the following detailed description of preferred embodiments thereof, which are best understood with reference to the accompanying drawings.

BRIEF DESCRIPTION OF THE DRAWINGS

In each drawing, the same reference numerals are applied to the same components.

DETAILED DESCRIPTION OF THE PREFERRED EMBODIMENTS

Subsidiary Explanation

Before describing the embodiments of the present invention, first, described is a comparative example which is the base of the embodiments for better understanding.

Figure 15:
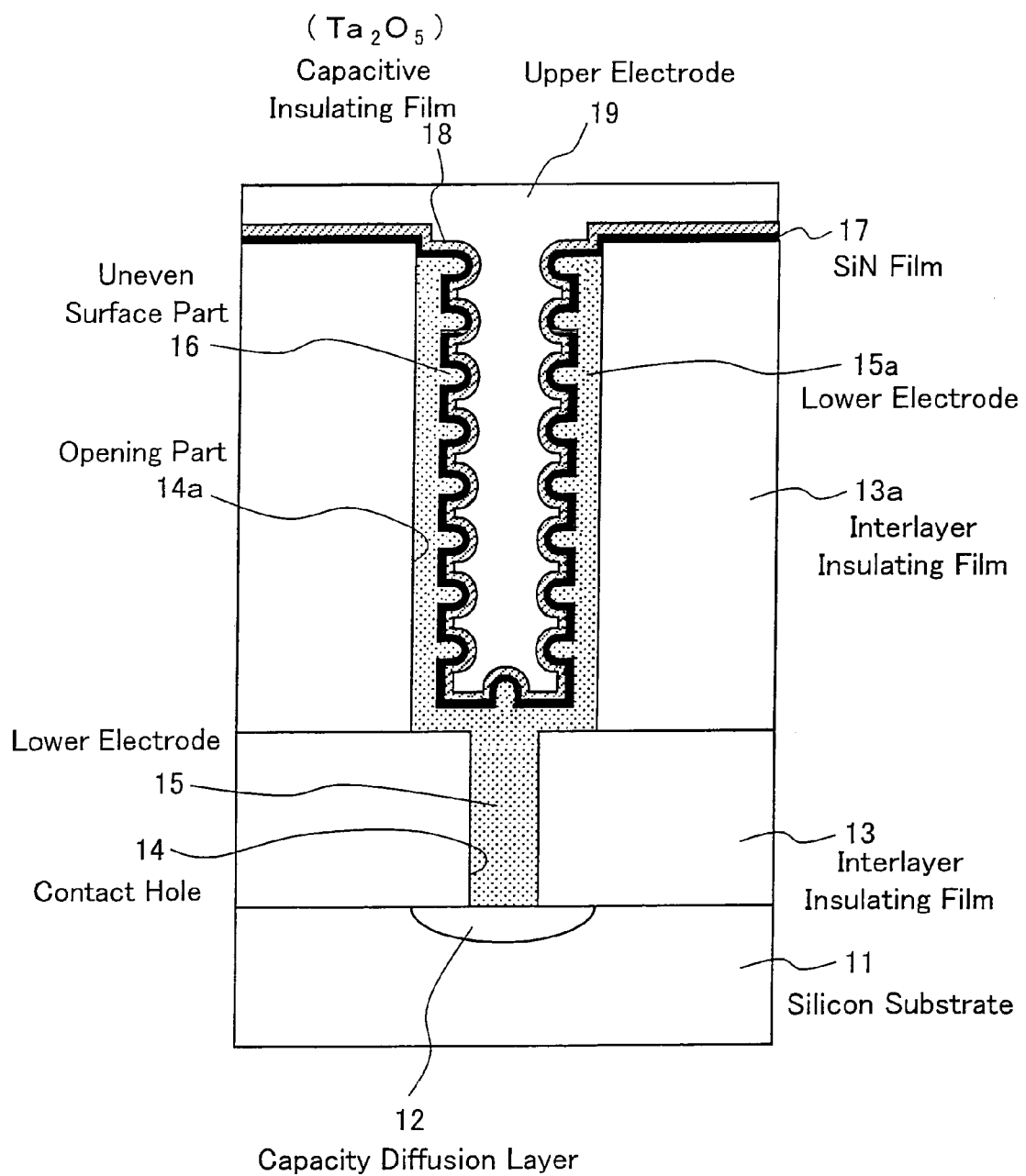
FIG. 15 is a structural cross section of a stacked capacitor of the comparative example.
Figure 16:
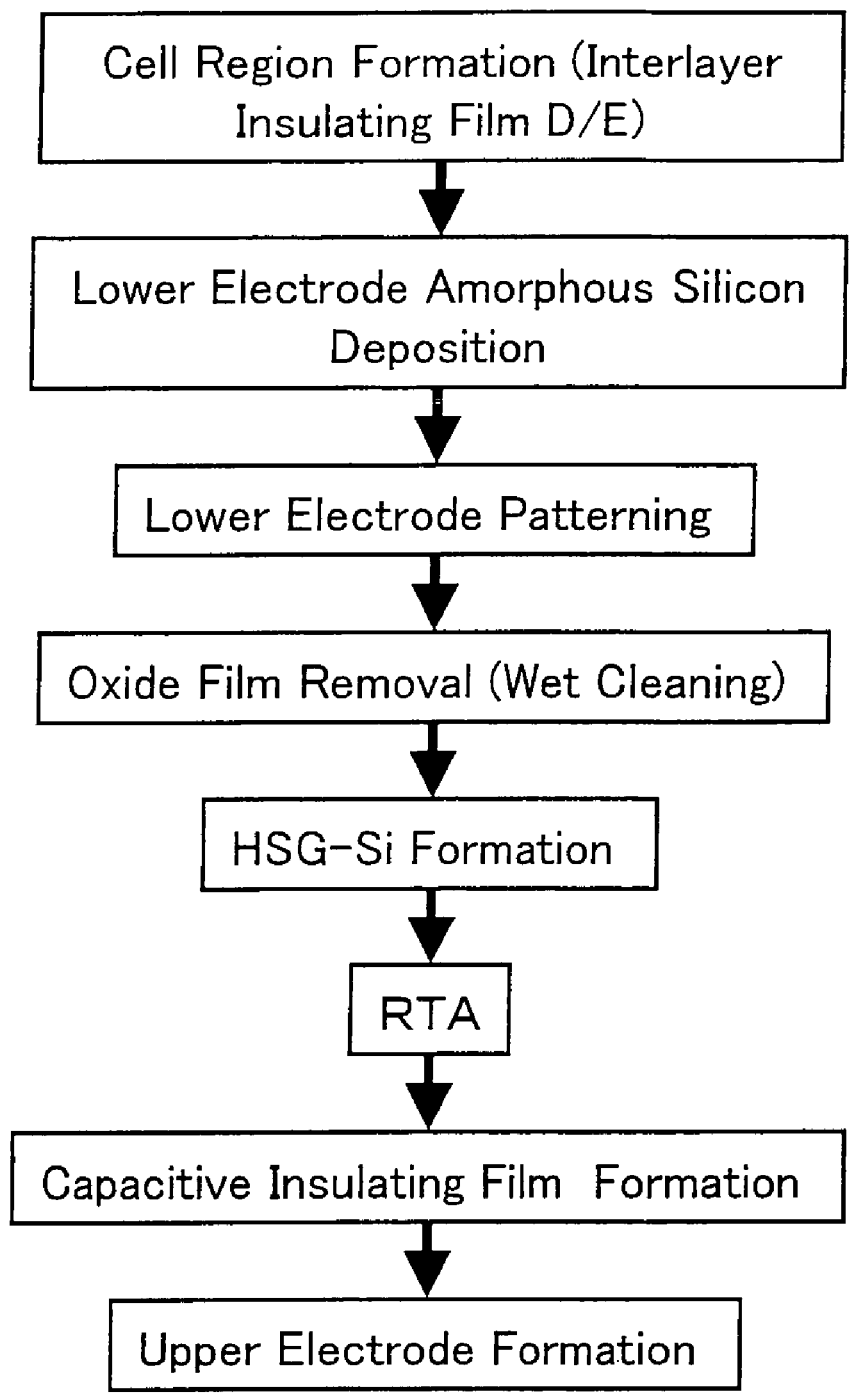
FIG. 16 is a block diagram for manufacturing the stacked capacitor of the comparative example.

Described is a stacked capacitor which, as a capacitive insulating film, uses tantalum oxide ($Ta_2O_5$) with a high dielectric constant and a dielectric voltage by referring to FIG. 15 and FIG. 16. A capacity diffusion layer 12 is formed on a surface of a silicon substrate 11, and an interlayer insulating film 13 is formed on the entire surface using a silicon oxide film. A contact hole 14 is formed in the interlayer insulating film 13 and amorphous silicon is filled therein for forming a lower electrode 15. Furthermore, an interlayer insulating film 13a is formed, and an opening part 14a is formed. A lower electrode 15a is formed in the inner wall of the opening part 14a and is then patterned. Then, the oxide film on the surface is removed for forming an uneven surface part 16. An amorphous silicon film (a-Si film) is formed on the uneven surface part 16 by low pressure chemical vapor deposition (LPCVD). Then, the surface of the a-Si film is micro-processed for patterning the lower electrode. Subsequently, it is cleaned by a chemical solution for removing the oxide film on the surface of the a-Si film. It is then inserted into a high-vacuum fission reactor for forming an HSG (Hemi Spherical Grain) nucleus constituted of a group of semispherical crystal grains on the a-Si film surface. Then, by applying a heat treatment, HSG-Si is formed. The a-Si film is made polycrystalline by the heat treatment. Subsequently, by applying $PH_3$ annealing, polycrystalline Si is made conductive for forming the lower electrode 15a. Then, by applying a heat treatment in an ammonia ($NH_3$) gas atmosphere, the lower electrode 15a of the polysilicon film is nitrided for forming a SiN film 17. Furthermore, after forming $SiO_2$, SiON, $Ta_2O_5$ and the like as a capacitive insulating film 18, an upper electrode 19 made of a TiN film is formed by CVD using $TiCl_4$ and $NH_3$ as the raw materials. Thereby, the capacitor is completed.

There are following shortcomings in the $Ta_2O_5$ capacitor and the manufacturing method.

Due to the shapes of the particles or HSG-Si grain boundaries generated at the time of forming the HSG-Si and the like, the electric field are locally concentrated in the protruded portion of the particle and the HSG-Si grain boundary. Thus, the TDDM (Time Dependent Dielectric Breakdown) characteristic is deteriorated. Furthermore, since the potential barrier becomes small, a large leak current is caused.

Moreover, in the process from forming the lower electrode to wiring, there may use reducing gas in hydrogen sintering (heat treatment) or when forming a film by $NH_3$ gas. The tantalum oxide film is reduced by the reducing gas and the TDDB characteristic is deteriorated.

Also, in the wiring step and the like after forming the upper electrode, plasma processing may be performed for forming an interlayer insulating film and a contact layer in contact. By the plasma processing, the $Ta_2O_5$ film is damaged and the TDDB characteristic is deteriorated.

Thus, the embodiments of the present invention have been designed to overcome the above-described shortcomings of the comparative example.

Explanation of Embodiments

In the followings, the capacitor and the manufacturing method according to the present invention will be described in detail by referring to the accompanying drawings.

First Embodiment

Figure 1:
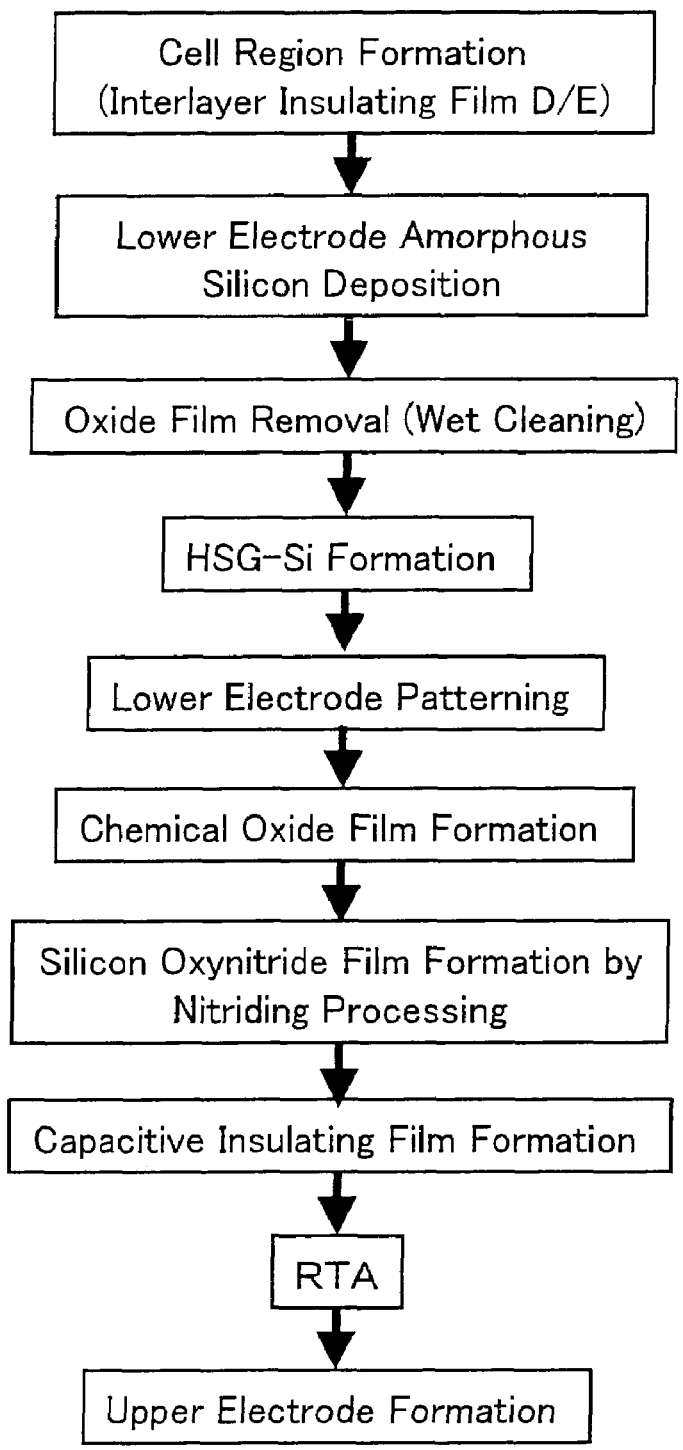
FIG. 1 is a flowchart for describing capacitor manufacturing methods according to a first embodiment and a second embodiment of the present invention.

The manufacturing method of the capacitor according to the first embodiment of the present invention will be described by referring to FIG. 1 (flowchart) and FIG. 2-FIG. 9 (cross sectional views of the steps).

Figure 2:
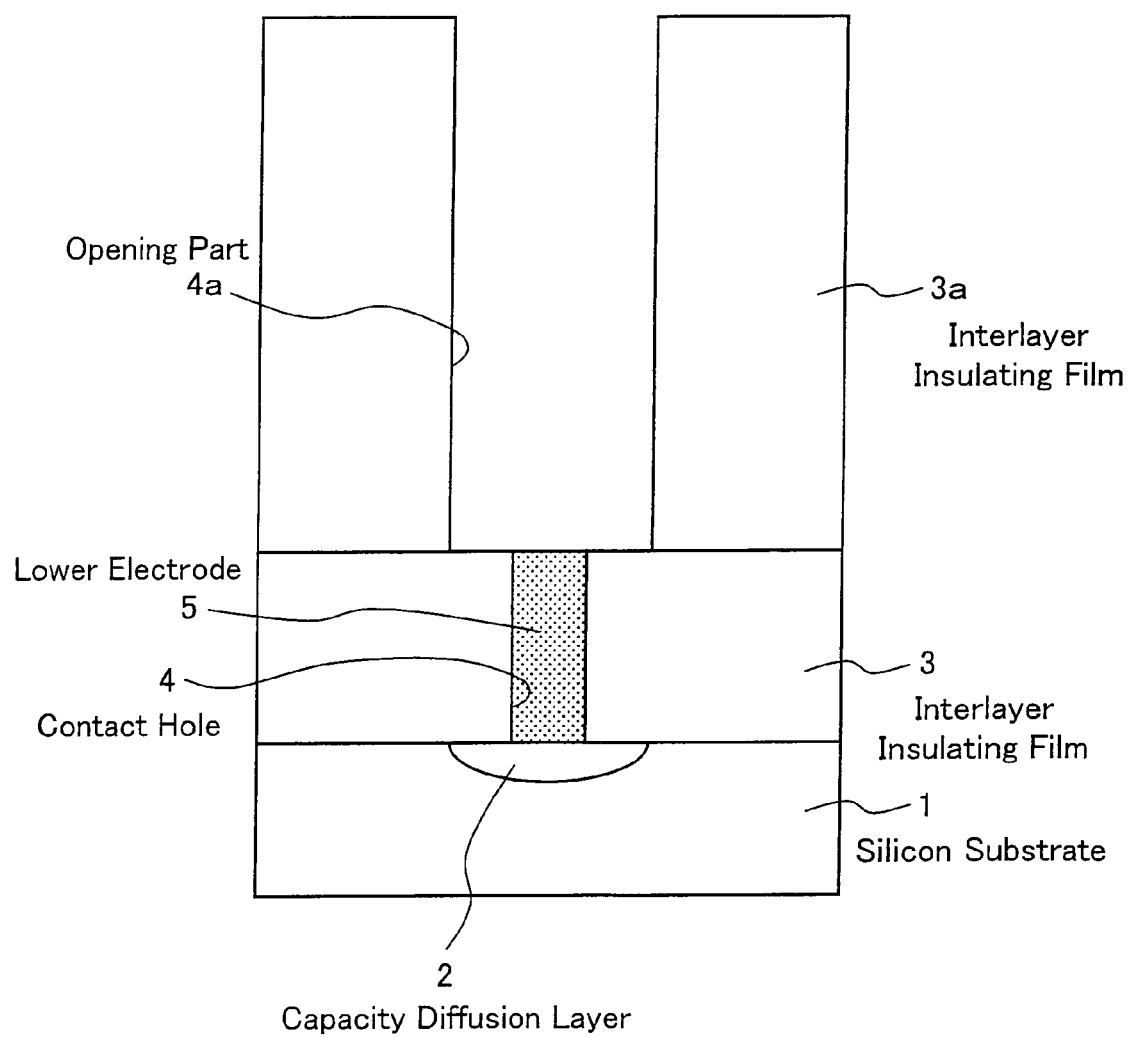
FIG. 2 is a cross sectional view (1) of the step for describing the capacitor manufacturing methods according to the first and the second embodiments of the present invention.

In the first step, an interlayer insulating film 3a is formed along with a cell region formed by dry etching (see FIG. 2).

Figure 3:
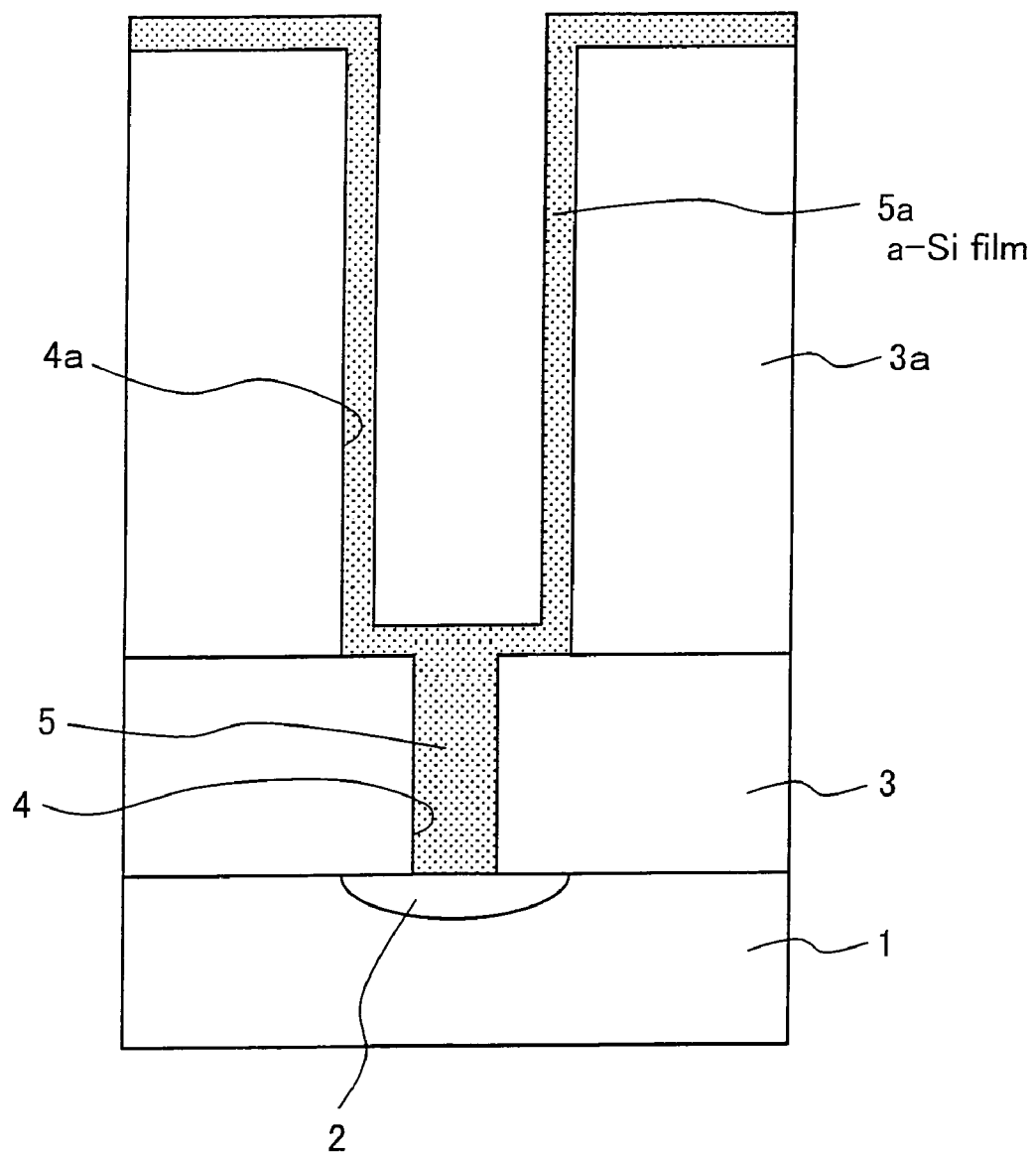
FIG. 3 is a cross sectional view (2) of the step for describing the capacitor manufacturing methods according to the first and the second embodiments of the present invention.

In the second step, amorphous silicon for a lower electrode 5a is deposited in an opening part 4a of the interlayer insulating film 3a (see FIG. 3).

In the third step, the oxide film on the amorphous silicon surface is removed by wet cleaning.

Figure 4:
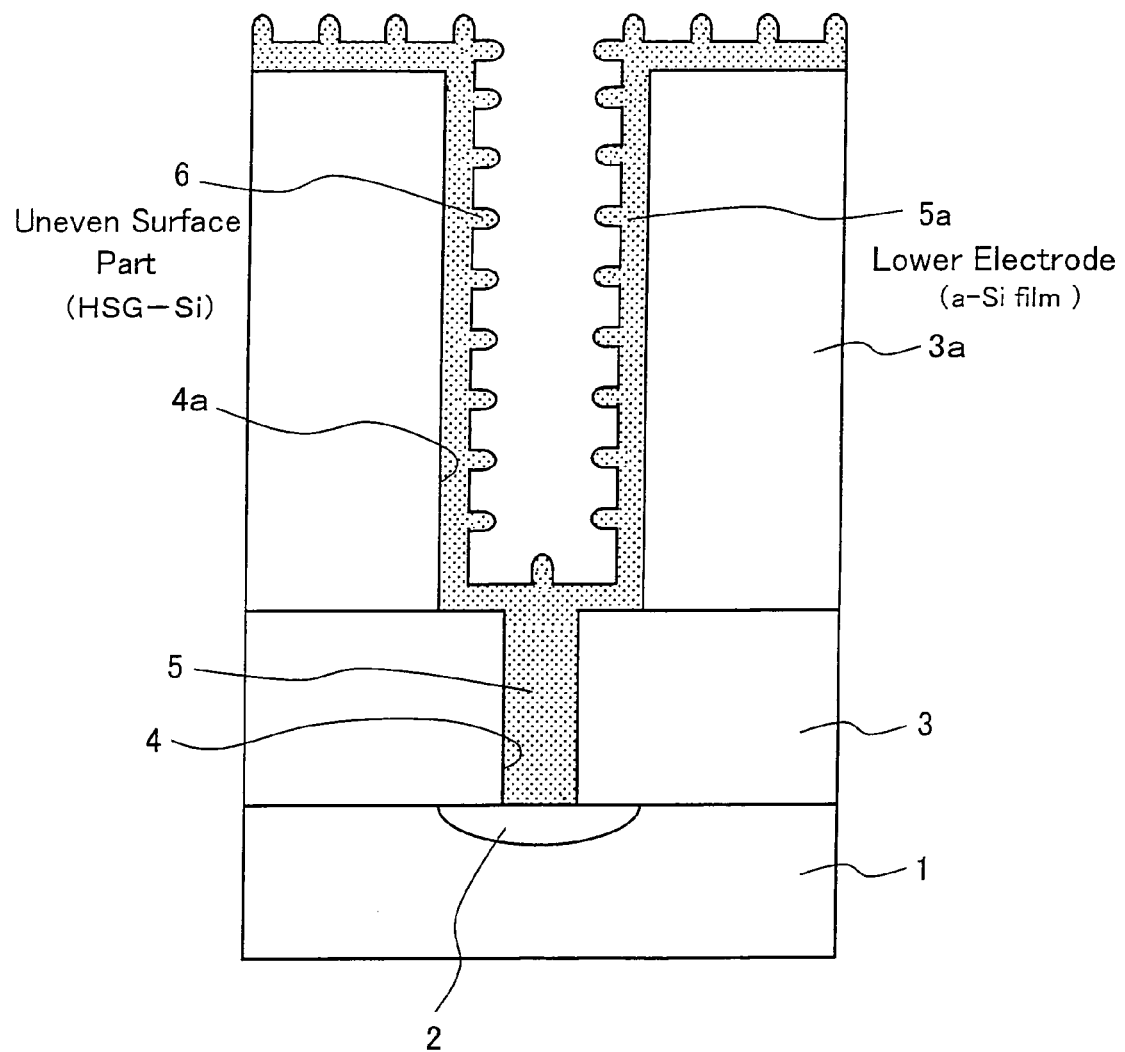
FIG. 4 is a cross sectional view (3) of the step for describing the capacitor manufacturing methods according to the first and the second embodiments of the present invention.

In the fourth step, an uneven surface part 6 of HSG-Si is formed in the amorphous silicon surface (see FIG. 4).

Figure 5:
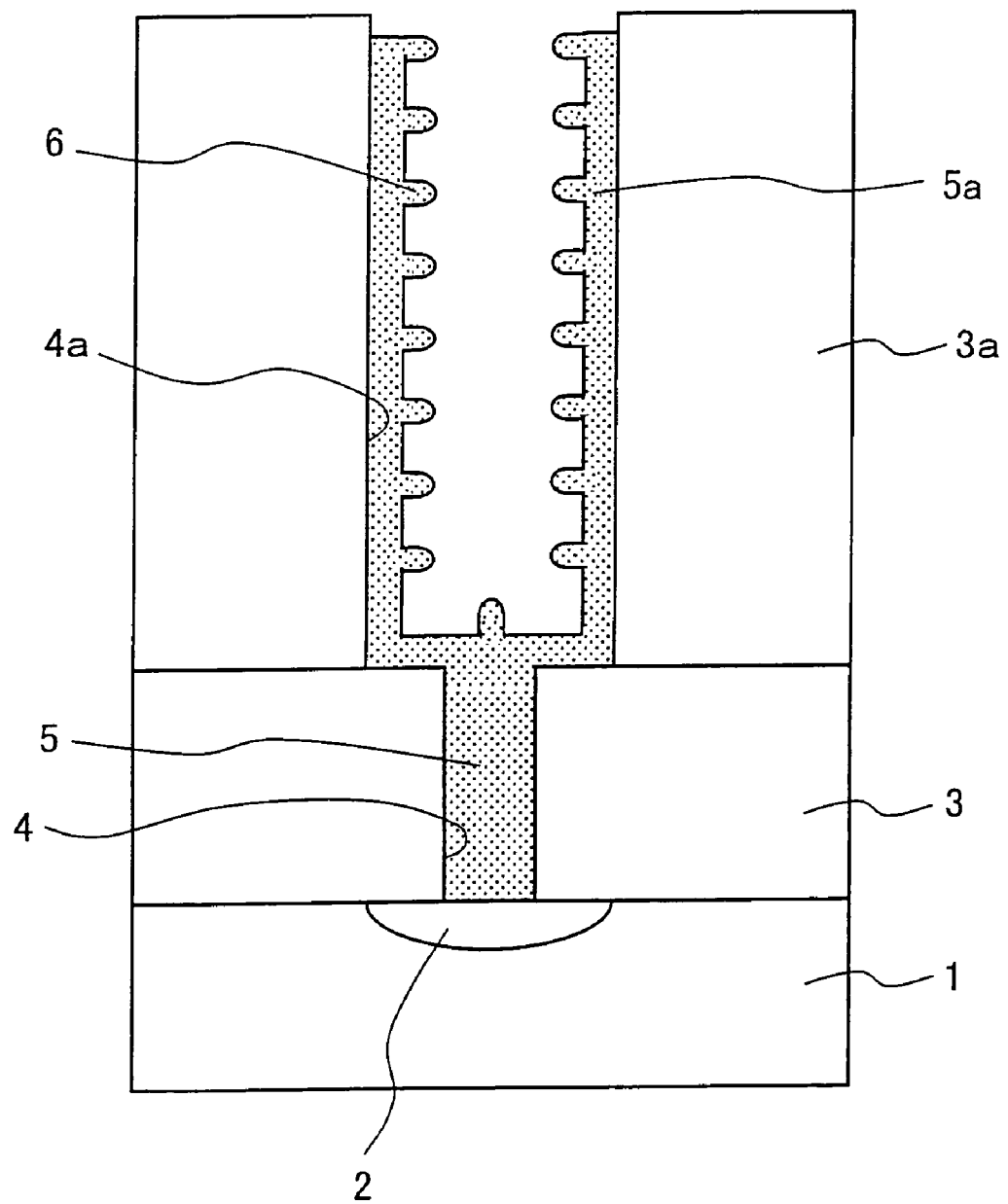
FIG. 5 is a cross sectional view (4) of the step for describing the capacitor manufacturing methods according to the first and the second embodiments of the present invention.

In the fifth step, performed is patterning of the lower electrode 5a made of the amorphous silicon (see FIG. 5).

Figure 6:
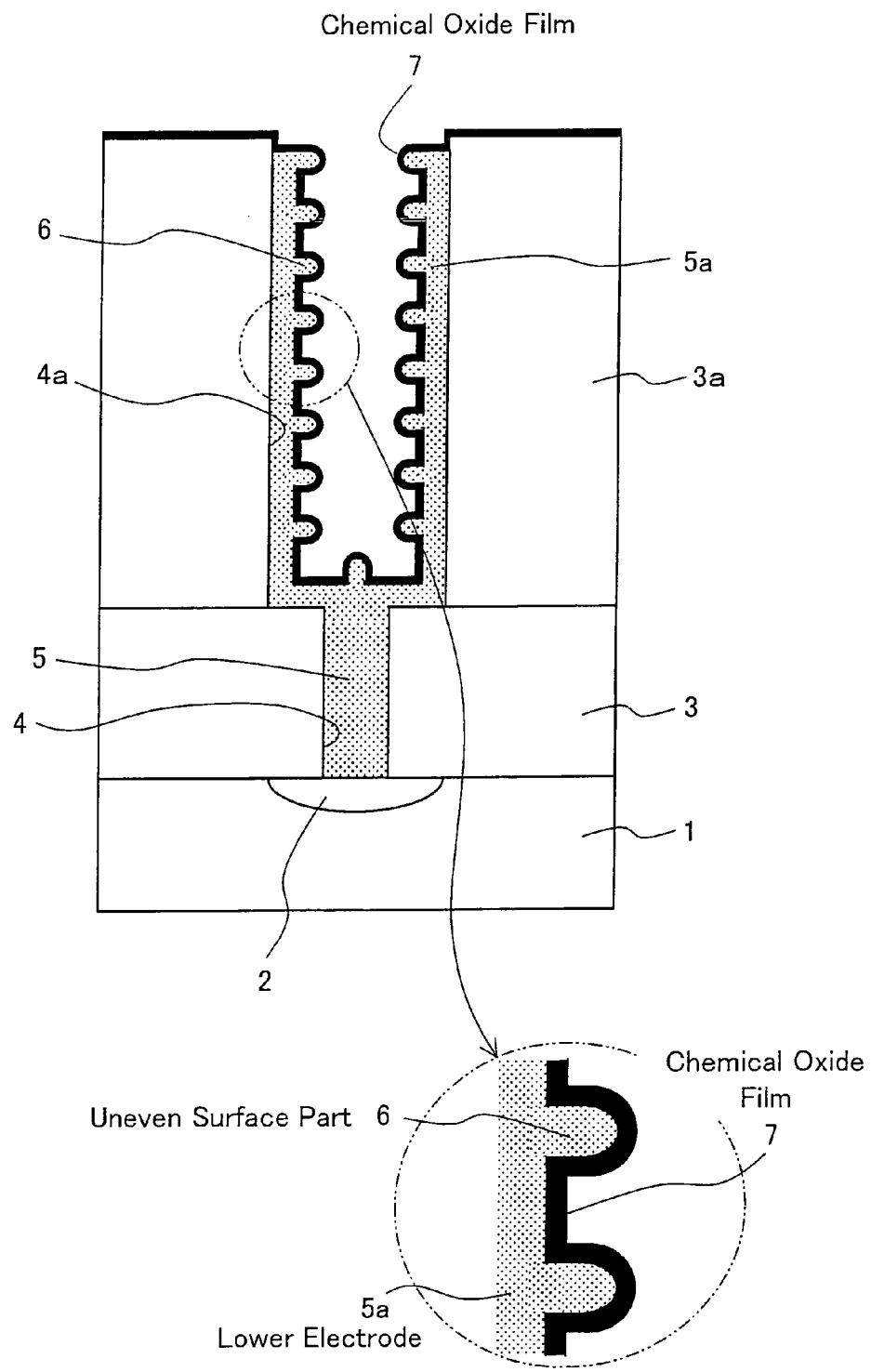
FIG. 6 is a cross sectional view (5) of the step for describing the capacitor manufacturing methods according to the first and the second embodiments of the present invention.

In the sixth step, a chemical oxide film 7 is formed on the HSG-Si surface of the amorphous silicon (see FIG. 6). The main part is illustrated by the enlarged view (same in FIG. 7-FIG. 9).

Figure 8:
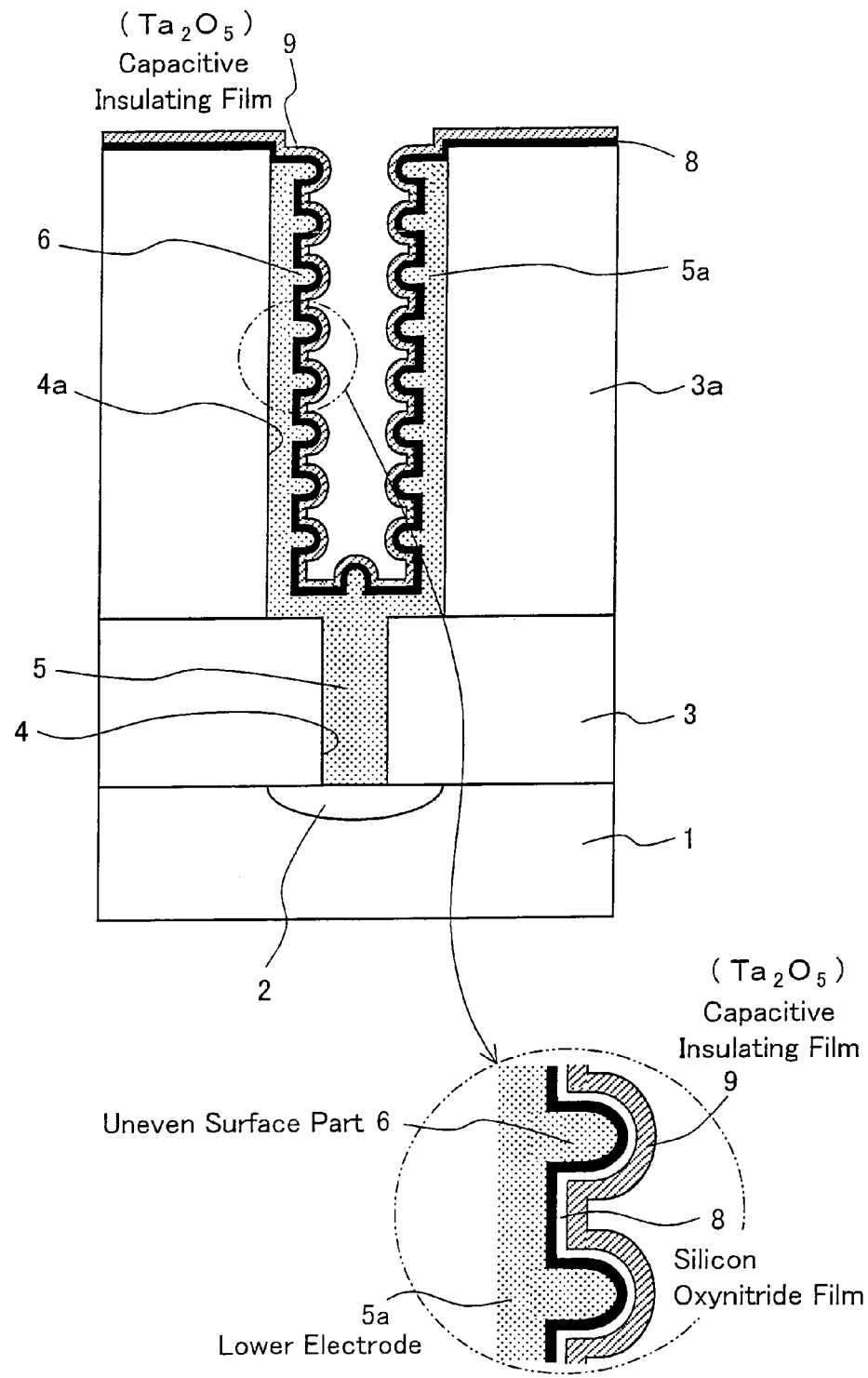
FIG. 8 is a cross sectional view (7) of the step for describing the capacitor manufacturing methods according to the first and the second embodiments of the present invention.

In the seventh step, the chemical oxide film 7 is modified by nitriding processing for forming a capacitive insulating film 9 (see FIG. 8).

Figure 7:
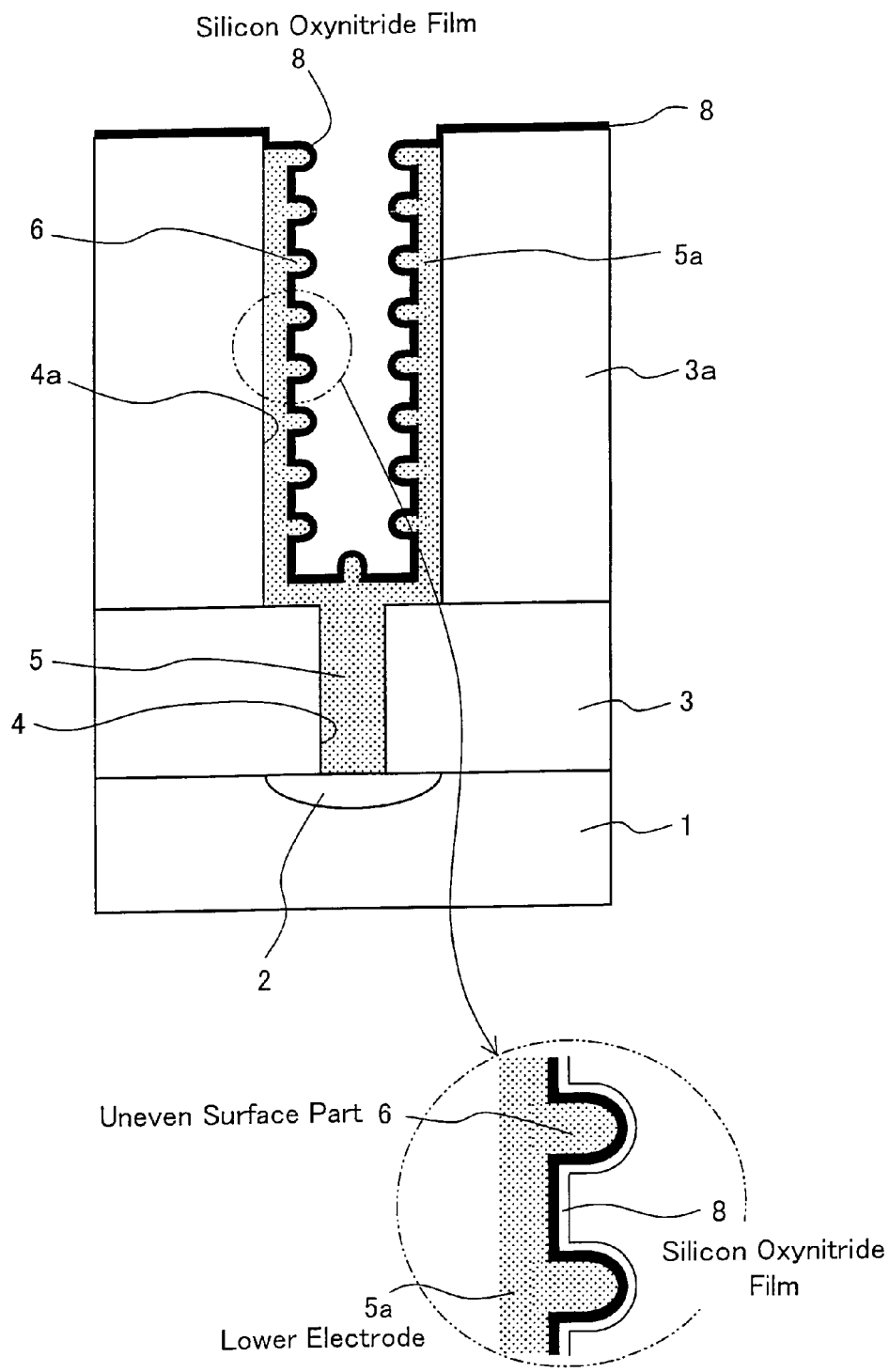
FIG. 7 is a cross sectional view (6) of the step for describing the capacitor manufacturing methods according to the first and the second embodiments of the present invention.

In the eighth step, the capacitive insulating film 9 is formed on the silicon oxynitride film 8 (see FIG. 7).

In the ninth step, RTA (Rapid Thermal Annealing) or RTO (Rapid Thermal Oxidation) is performed.

Figure 9:
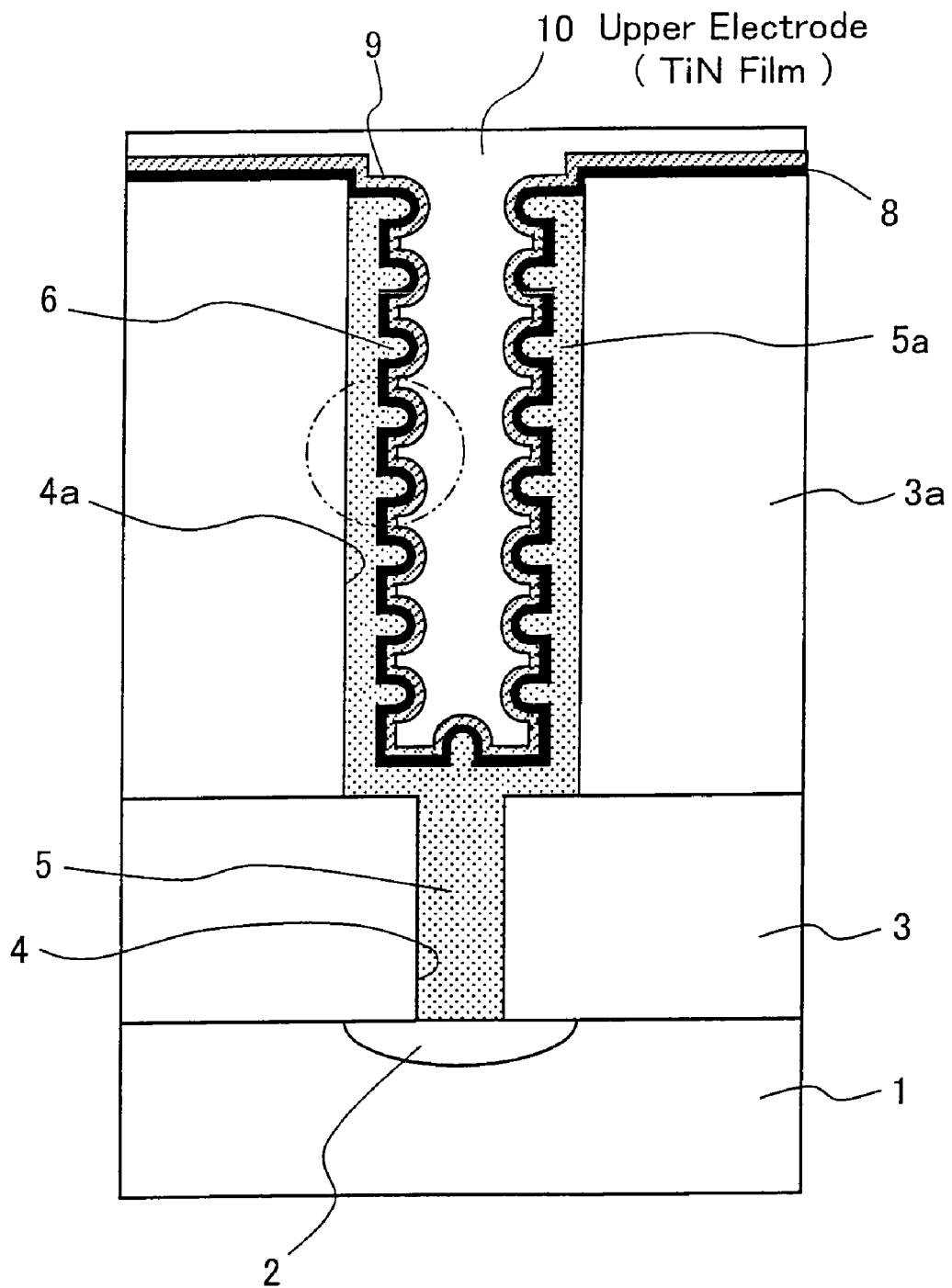
FIG. 9 is a cross sectional view (8) of the step for describing the capacitor manufacturing methods according to the first and the second embodiments of the present invention.

In the tenth step, an upper electrode 10 is formed (see FIG. 9).

In the followings, each of the above-described steps will be described in order.

(1) As shown in FIG. 2, a capacity diffusion layer 2 is formed on the surface of a silicon substrate 1. Then, the interlayer insulating film 3 is formed over the entire surface. The interlayer insulating film 3 is formed of a silicon oxide film or a BPSG film (a silicon oxide film containing boron glass and phosphorous glass). The contact hole 4 reaching the surface of the capacity diffusion layer 2 is formed on the interlayer insulating film 3. Amorphous silicon is filled to the contact hole 4 for forming the lower electrode 5 which connects to the capacity diffusion layer 2. Then, the interlayer insulating film 3a is formed over the lower electrode 5 and dry etching (D/E) is performed for forming a memory cell region, and the opening part 4a is formed in the interlayer insulating film 3a.

(2) Next, as shown in FIG. 3, an a (amorphous)-Si film 5a (film thickness is 25-50 nm) is deposited by low-pressure CVD (chemical Vapor Deposition) using $SiH_4$ or $Si_2H_6$ as a reaction gas. The temperature for forming the film is set in the range of at 500° C.-550° C.

(3) Subsequently, as shown in FIG. 4, the above-described semiconductor substrate is immersed in dilute hydrofluoric acid which is a mixed chemical solution of hydrofluoric acid and pure water for removing the natural oxide film removal of the oxide film) and the like on the a-Si film surface. Here, the concentration of fluorine in the dilute hydrofluoric acid is 0.50 vol. %.

(4) Then, the semiconductor substrate is inserted into a high-vacuum fission reactor of a process chamber for applying a heat treatment (pressure is about $1 \times 10^{-5}$ Pa, temperature is about 600° C.-650° C., flow amount of $SiH_4$ is 50 sccm). Thereby, an HSG nucleus is formed on the a-Si film surface and, furthermore, HSG-Si of the semispherical crystal grains is formed. By this heat treatment, the a-Si film is made polycrystalline. Then, by applying $PH_3$ annealing, the polycrystalline Si film having the uneven surface part 6 is made conductive for forming the lower electrode 5a. In this manner as described above, the lower electrode 5a of the capacitor, which is made of polycrystalline silicon having the uneven surface part 6 on its surface, is formed.

(5) Next, as shown in FIG. 5, the lower electrode 5a is patterned through micro-processing the lower electrode 5a by photolithography and dry etching.

(6) Then, as shown in FIG. 6, it is immersed in dilute hydrofluoric acid, which is a mixed chemical solution of hydrofluoric acid and pure water, for removing (removal of oxide film) the natural oxide film and the like on the surface of the HSG-Si uneven surface part 6. Then, by immersing it in a chemical solution with oxidizing effect, e.g., hydrogen peroxide water, ozone water, and nitrate water, a chemical oxide film 7 in a thickness of 0.5-1.5 nm as of the silicon oxide film is formed on the HSG-Si surface.

When the film thickness of the chemical oxide film 7 is less than 0.5 nm, it is difficult to control the film thickness. When the film thickness of the chemical oxide film 7 is larger than 2.0 nm, the capacitor comes to have the series structure of the $SiO_2$ film and the metal oxide film so that the deterioration of the capacity becomes drastic. Therefore, the film thickness of the chemical oxide film 7 is preferable to be 0.5-1.5 nm.

As for the above-described chemical solutions, nitrate water has the highest oxidizing effect, then the ozone water, and the hydrogen peroxide water has the smallest. Thus, by a selection of the chemical liquid with the oxidizing effect, it is possible to improve the throughput and the yield.

(7) Next, as shown in FIG. 7, plasma processing is performed in a nitrogen atmosphere (pressure is 30 Pa, RF power is 250 W, temperature of wafer stage is at 400° C.). Thereby, the HSG-Si surface is nitrided through the chemical oxide film 7 so as to modify the chemical oxide film 7 into a silicon oxynitride film 8 with a thickness of 1.0-3.5 nm.

(8) Then, as shown in FIG. 8, a capacitive insulating film 9 of $Ta_2O_5$ is formed in 8-12 nm on the silicon oxynitride film 8 by CVD. As for the forming condition, the pressures is about 30 Pa, the temperature is at about 450° C.-500° C., pentaetoxytantalum (Ta $(OC_2H_5)$ 5) as the raw material gas is about 0.1 cc, and $O_2$ gas is about 500 sccm.

(9) Subsequently, for densifying the $Ta_2O_5$ film and decreasing the defect density by supplying oxygen, a heat treatment by RTA (Rapid Thermal Annealing) is performed in an oxygen atmosphere at 800° C. for about 90 sec.

(10) At last, as shown in FIG. 9, a TiN film as an upper electrode 10 is formed using $TiCl_4$ (17.5 sccm) and $NH_3$ (400 scam) as the raw material by CVD with the pressure of 40 Pa and the film forming temperature of at 550° C.-650° C. Furthermore, a resist pattern (not shown) to be a mask for patterning the upper electrode 10 is formed thereon. With the resist pattern being the mask, the unnecessary portion of the TiN film is etched for forming the upper electrode 10 made of the TiN film. Thereby, manufacture of the $Ta_2O_5$ capacitor is completed.

There are following advantages on the capacitor and the manufacturing method of the above-described embodiment.

Before forming the capacitive insulating film 9 made of the $Ta_2O_5$ film (metal oxide film), the chemical oxide film 7 is formed by performing a wet treatment to the HSG-Si of the lower electrode 5a which is made conducive. Thereby, it is possible to round the protrusion parts of the particles generated on the HSG-Si of the lower electrode 5a or the protrusion part of the HSG-Si grain boundary. As a result, it enables to suppress concentration of the electric field in the protrusion parts so that a decrease in the leak current and extension of the life of the TDDB characteristic can be achieved.

Further, by forming the chemical oxide film 7 on the conductive HSG-Si surface, the more excellent potential barrier than the $Ta_2O_5$ film can be formed. Thereby, it is possible to decrease the leak current and to extend the life of the TDDB characteristic.

With this embodiment, it is possible to manufacture the capacitor as described above with less leak current and sufficiently long life of the TDDB characteristic by relatively a low thermal budget of at 800° C. and for 90 sec. at the maximum.

Second Embodiment

Next, the manufacturing method of the capacitor according to the second embodiment of the present invention will be described. In this embodiment, in the step of FIG. 9, the temperature for forming the TiN film to be the upper electrode 10 is increased (increased about 50° C.-100° C.) than that of the first embodiment (550° C.-650° C.).

In the same manner as that of the first embodiment, the steps of FIG. 2-FIG. 8 are executed. Then, as sown in FIG. 9, a TiN film as an upper electrode 10 is formed using $TiCl_4$ (17.5 sccm) and $NH_3$ (400 sccm) as the raw material by CVD with the pressure of 40 Pa and the film forming temperature of at 650° C.-700° C. The temperature for forming the TiN film is about 50° C.-100° C. higher than the case of the first embodiment (550° C.-650° C.). This is for reducing the residual concentration of $NH_3$ in the TiN film to suppress the deterioration of the TDDB characteristic because $NH_3$ has a reduction effect.

When the TiN is formed at the temperature of less than 650° C. (for example, 630° C.), the residual concentration of $NH_3$ in the TiN film becomes excessive compared to the case of forming it at 650° C. (for example, 680° C.) or higher. On the other hand, when it is higher than 680° C., re-diffusion of dopant is caused so that the impurity profile may change thereby influencing the device characteristic. Therefore, the temperature for forming the TiN film is set at 650° C.-700° C.

Subsequently, a resist pattern (not shown) to be a mask for patterning the upper electrode 10 is formed thereon. With the resist pattern being the mask, the unnecessary portion of the TiN film is etched for forming the upper electrode 10 made of the TiN film. Thereby, manufacture of the $Ta_2O_5$ capacitor is completed.

As described above, in the manufacturing method of the capacitor according to the embodiment, in addition to the advantages of the first embodiment, the residual concentration of $NH_3$ on the TiN film is decreased by setting the temperature for forming the TiN film high so as to suppress the reduction effect of the $Ta_2O_5$ film. Thus, it works to suppress the deterioration of the TDDB characteristic.

Results of Measurements in Embodiments

Next, the results of measurements of the embodiments will be described by referring to FIG. 10-FIG. 14.

Figure 10:
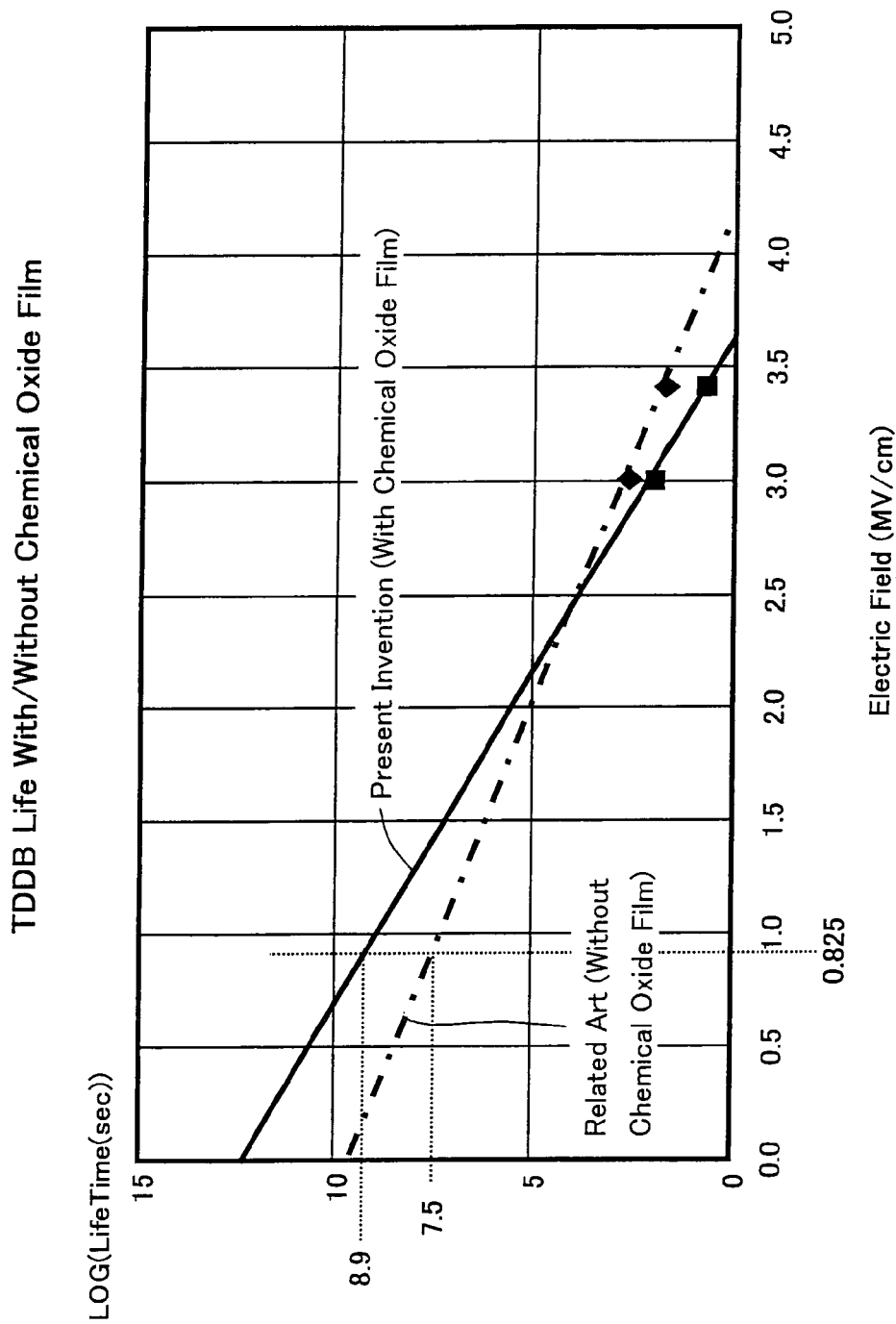
FIG. 10 is a TDDB characteristic diagram of the capacitor according to the first embodiment of the present invention.

FIG. 10 is a TDDB characteristic graph of the first embodiment, showing the difference between those with or without the chemical oxide film forming step shown in FIG. 6. The condition of the measurement was of 64 Kbit scale and the measurement temperature was at 100° C.

By adding the chemical oxide film forming step (with the chemical oxide film processing), the life of the TDDB characteristic was increased to be about 25 years, which was about a digit longer than the case without the chemical oxide film processing, which was about 1 year. The life of the TDDB characteristic was estimated at 0.825 V. The basis of calculation is as follows.

The value of the life at 0.825 V in the case of the comparative example is 7.5 and is 8.9 in the embodiment of the present invention. In calculation, $10^{7.5}(sec)=x1(year) \times (60 \times 60 \times 24 \times 365)$, from this,
$X1=1.0$(year)

$10^{8.9}(sec)=x2(year) \times (60 \times 60 \times 24 \times 365)$, from this,
$X2=25.2$(year)

Figure 11:
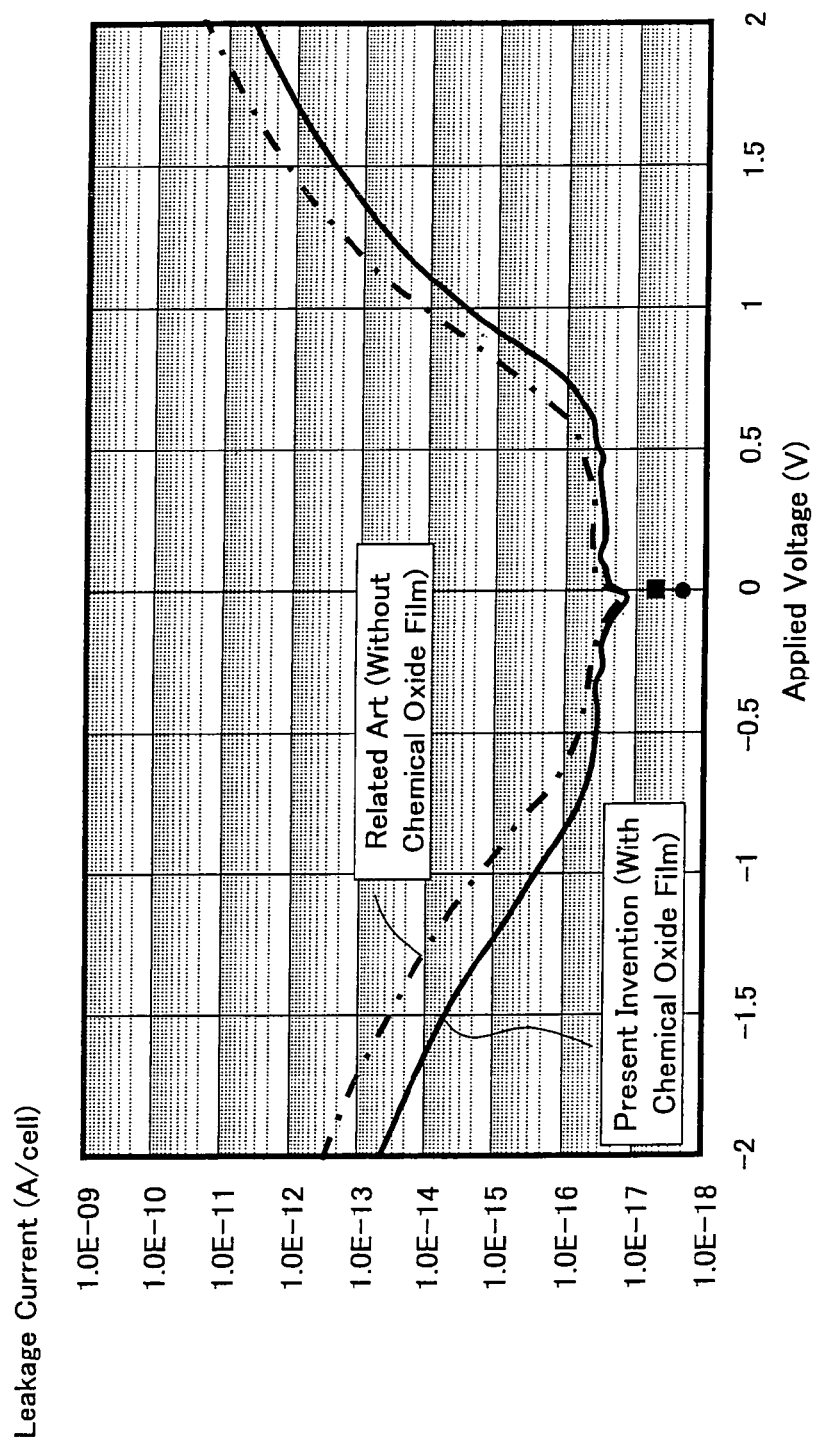
FIG. 11 is an I-V characteristic diagram of the capacitor according to the first embodiment of the present invention.

FIG. 11 is a leak current-voltage characteristic graph of the first embodiment, showing the difference between those with or without the chemical oxide film forming step shown in FIG. 6. The measurements were carried out at a room temperature.

It was found that, in both cases of applying the positive bias or the negative bias, the leak level was improved by about a digit with the chemical oxide film than without the chemical oxide film.

Figure 12:
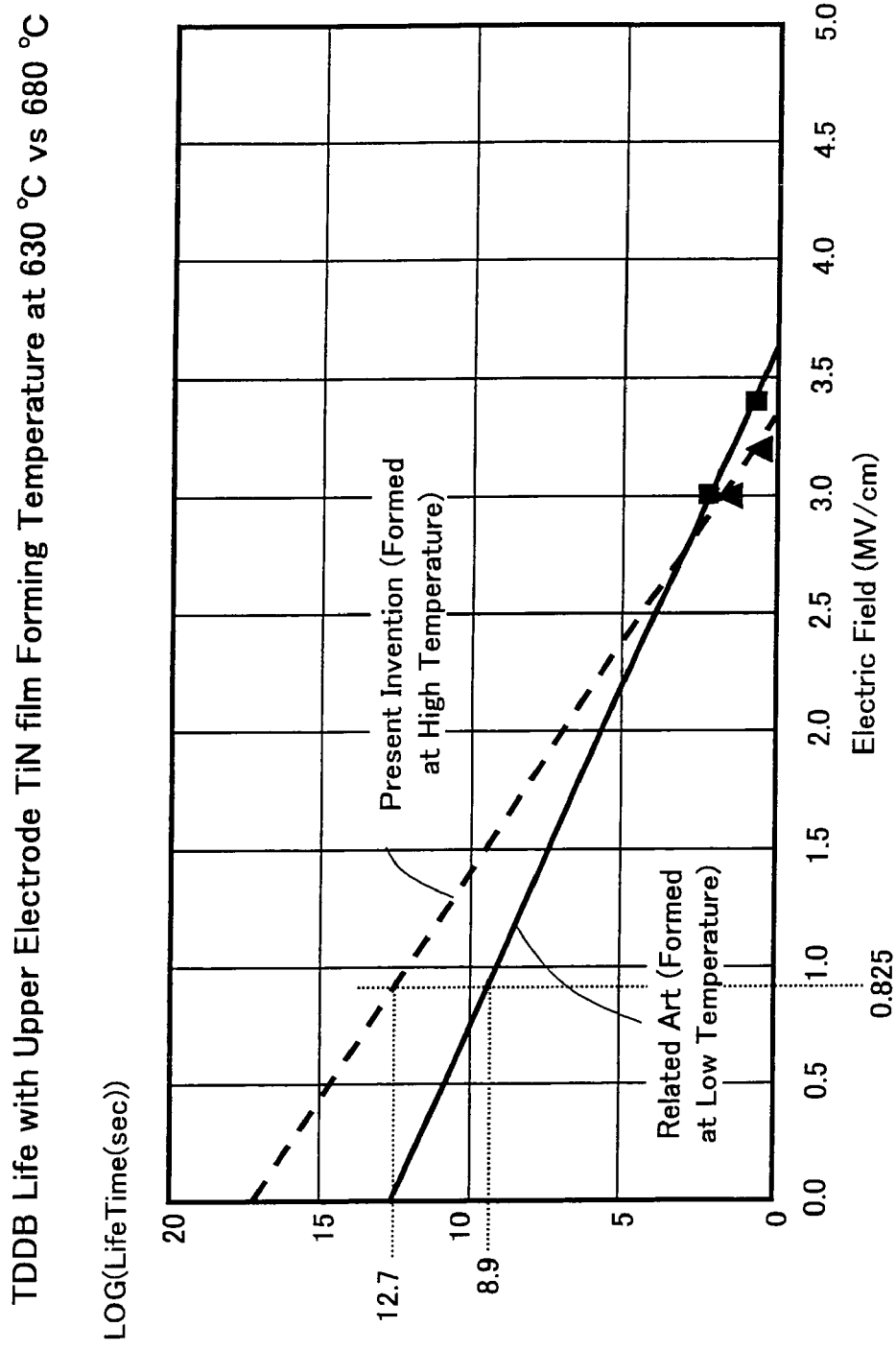
FIG. 12 is a TDDB characteristic diagram of the capacitor according to the second embodiment of the present invention.

FIG. 12 is a TDDB characteristic graph of the second embodiment, showing the case where the TiN film processing shown in FIG. 9 was performed at the low forming temperature (630° C.) and the case where it was performed at the higher temperature (680° C.). The condition of the measurement was of 64 Kbit scale and the measurement temperature was at 100° C.

The TDDB characteristic when forming the TiN film as the upper electrode at the low temperature was about 25 years. On the contrary, in the case of forming the film at the high temperature with the chemical oxide film processing, the life was dramatically increased to be about over 100,000 years. The life of the TDDB characteristic was estimated at 0.825 V. The basis of calculation is as follows.

The value of the life at 0.825 V in the case of forming the film at the low temperature is 8.9 and is 10.2 in the case of forming the film at the high temperature. In calculation, $10^{8.9}(sec)=x2(year)\times(60\times60\times24\times365)$, from this,
$X2\approx25.2(year)$ $10^{12.7}(sec)=x3(year)\times(60\times60\times24\times365)$, from this,
$X3\approx15.9\times10^{4}(year)$ Next, FIG. 3 shows the result of analysis performed on the capacitor structure according to the embodiment of the present invention and that of the comparative example by SIMS (Secondary Ion Mass Spectroscopy). FIG. 14 shows the processing flow of the samples used in FIG. 13.

Figure 13:
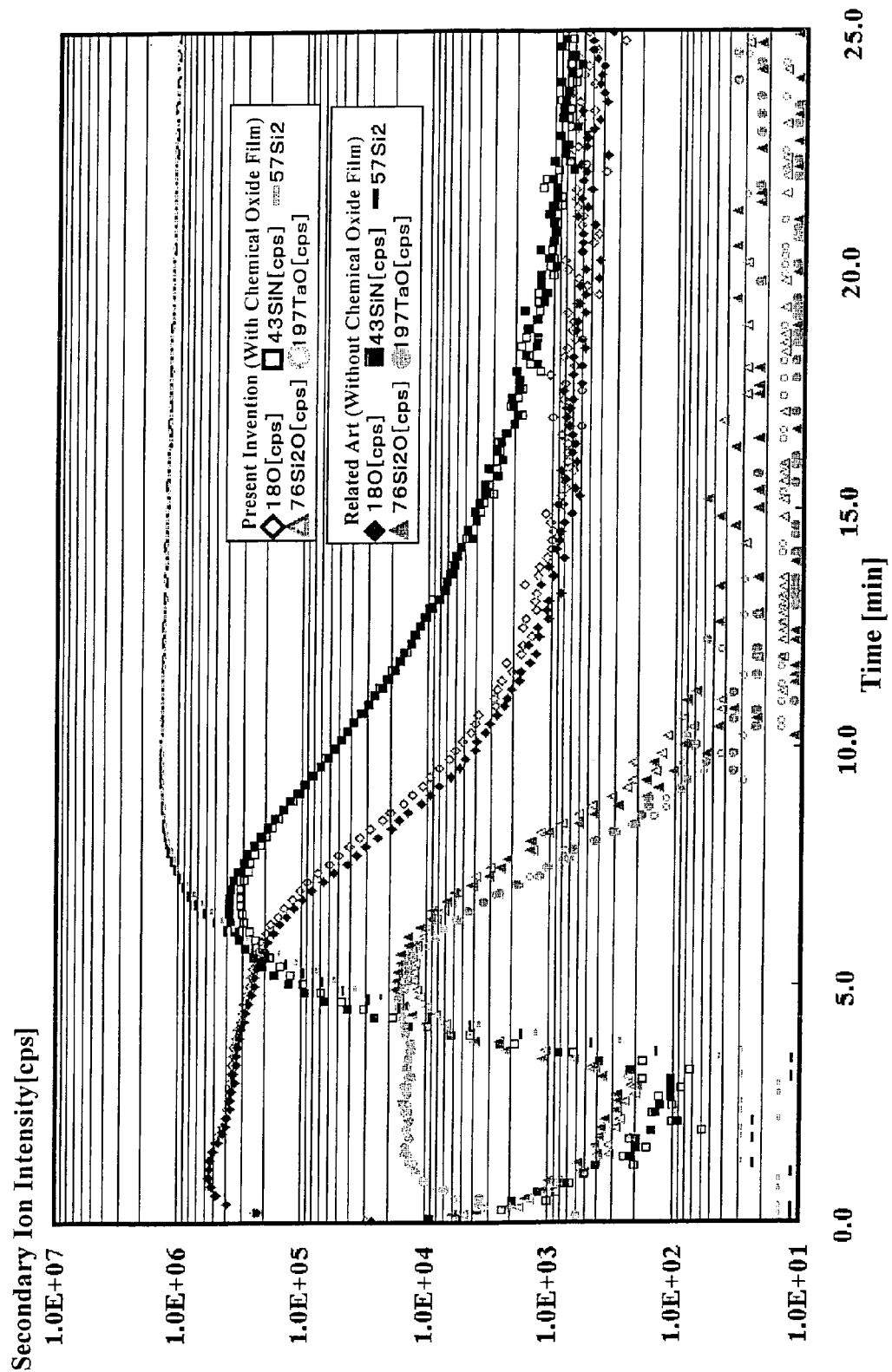
FIG. 13 is a diagram for showing SIMS data in the capacitor structure of the embodiment of the present invention and that of a comparative example.
Figure 14:
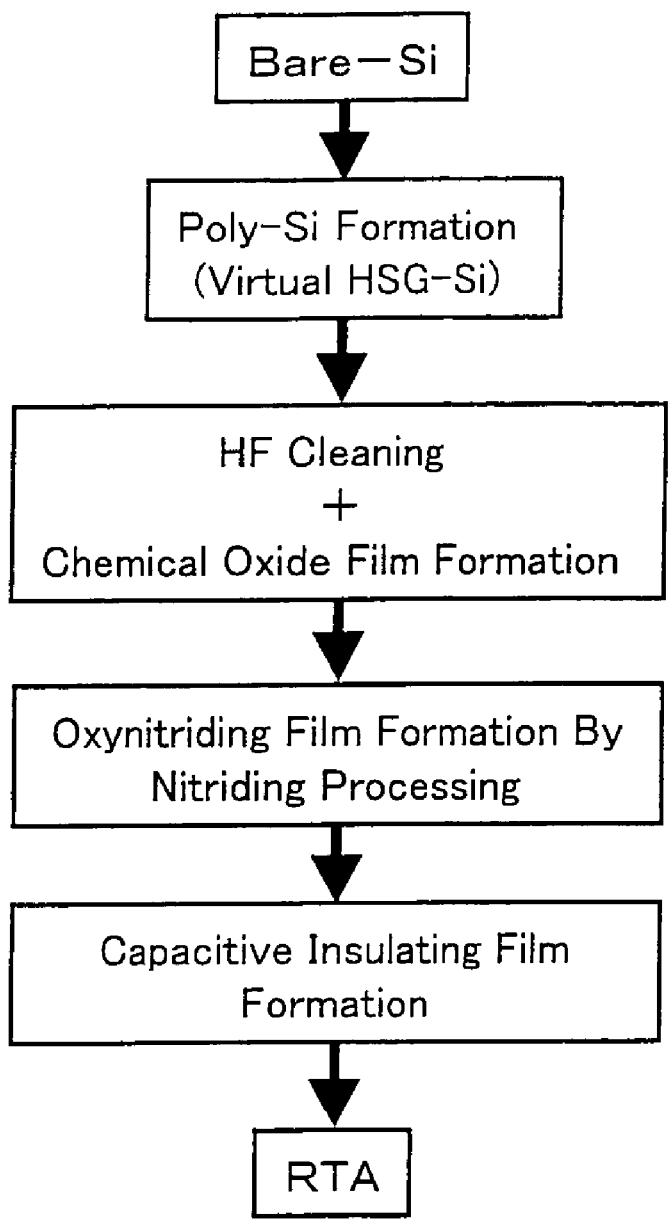
FIG. 14 is a flow chart of making an SIMS sample with the capacitor structure of the embodiment of the present invention.

When checking the intensity distributions of oxygen at m/e=18 in FIG. 13, there are more distributions on Poly-Si side in the case of the embodiment (with the chemical oxide film) of the present invention compared to the comparative example. This indicates that the silicon oxide layer (chemical oxide film) formed by chemical oxidation shown in FIG. 6 is modified into the silicon oxynitride film by the plasma processing shown in FIG. 7 and, then, by the RTA processing after forming the capacitive insulating film as in FIG. 8, a part of oxygen in the silicon oxide layer is diffused onto the lower electrode side.

Figure 17:
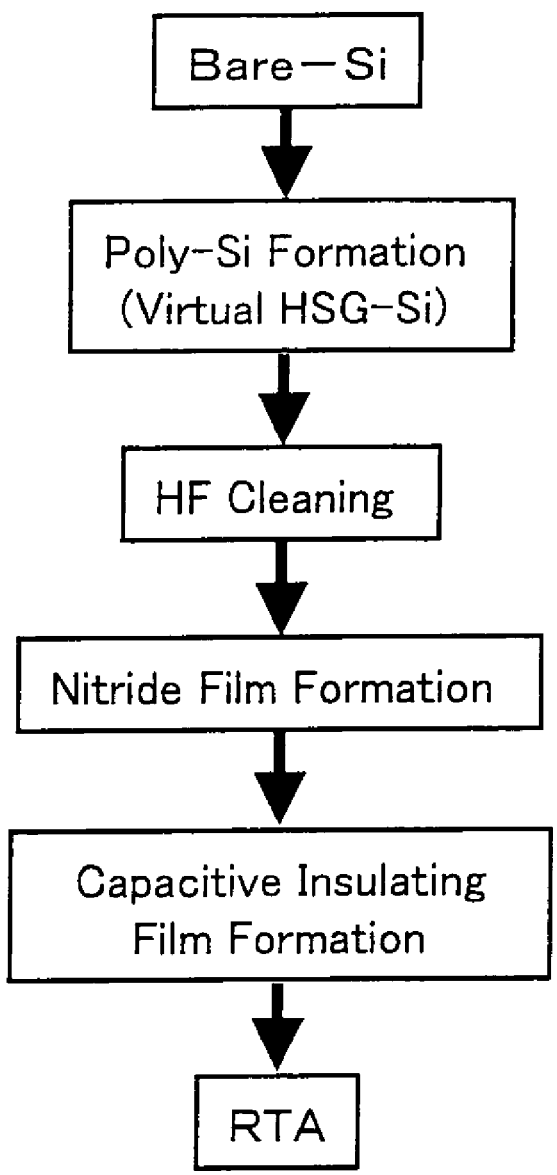
FIG. 17 is a flowchart for making an SIMS sample with the capacitor structure of the comparative example.

In the case of the comparative example, as shown in FIG. 17, for the sample of the SIMS analysis, Poly-Si of 200 nm was formed as a virtual HSG-Si on Bare-Si at 620° C. It was then immersed in dilute hydrofluoric acid which was a mixed chemical solution of hydrofluoric acid and pure water for removing (removal of the oxide film) the natural oxide film and the like on the Si film surface. The fluorine concentration in the dilute hydrofluoric acid was 0.50 vol. %. After performing the same plasma nitriding processing as those of the first and second embodiments and forming the $Ta_2O_5$ (10 nm) film as the capacitive insulating film, RTO processing (at 800° C., for 90 sec) was performed in an oxygen atmosphere.

In the case of the comparative example, as shown in FIG. 14, for the sample of the SIMS analysis, Poly-Si of 200 nm was formed as a virtual HSG-Si on Bare-Si at 620° C. It was then immersed in dilute hydrofluoric acid which was a mixed chemical solution of hydrofluoric acid and pure water for removing (removal of the oxide film) the natural oxide film and the like on the Si film surface. Then, an ozone water treatment was performed for forming the chemical oxide film of about 1.1 nm. The fluorine concentration in the dilute hydrofluoric acid was 0.50 vol. %. After performing the same plasma nitriding processing as those of the first and second embodiments and forming the $Ta_2O_5$ (10 nm) film as the capacitive insulating film, RTO processing (at 800° C., for 90 sec) was performed in an oxygen atmosphere.

The present invention is not limited only to the above-described embodiments but various modifications are possible within the spirit and the broad scope of the appended claims.

As has been described above in detail, in the capacitor of the present invention, the chemical oxide film rounds the particle protrusion part on the surface of the lower electrode or the boundary protrusion part of the uneven surface part, which helps to increase the life of the TDDB characteristic by suppressing the concentration of the electric field. Furthermore, by forming the excellent potential barrier than the metal oxide film and also by suppressing the concentration of the electrical field, it enables to decrease the leak current. Therefore, in the capacitor using the metal oxide film with a high dielectric constant, it becomes possible to extend the life of the TDDB characteristic and to decrease the leak current.

Furthermore, in the first capacitor manufacturing method of the present invention, the silicon clean surface of the uneven surface part of the lower electrode is exposed before forming the silicon oxynitride film. Then, the wet treatment is performed by the chemical solution with the oxidizing effect for forming the chemical oxide film on the surface of the uneven surface part. Thereby, it can achieve the effect that the chemical oxide film rounds the particle protrusion part on the surface of the lower electrode or the boundary protrusion part of the uneven surface part. In other words, in the capacitor using the metal oxide film with the high dielectric constant, it becomes possible to suppress an increase of the leak current and the deterioration of the TDDB characteristic caused by the particle protrusion part or the boundary protrusion part of the uneven surface part.

In addition to the above-described effect, in the second capacitor manufacturing method of the present invention, the TiN film as the upper electrode is formed at 650° C.-700° C. on the capacitive insulating film. Thereby, it is possible to suppress the $NH_3$, which is the raw material for forming the TiN, from being taken into the TiN film. Thus, it has an effect of suppressing the reduction of the metal oxide film as the capacitive insulating film. In other words, in the capacitor using the metal oxide film with the high dielectric constant, the life of the TDDB characteristic can be more improved.

The capacitor of the present invention comprises the insulating film with less leak current and high dielectric constant with sufficiently long life of the Time Dependent Dielectric Breakdown (TDDB), which is effective to be used as a charge storage capacitor in a memory cell of a DRAM, etc.

What is claimed is:

1. A capacitor manufacturing method, comprising the steps of:
   forming an opening part in an interlayer insulating film on a semiconductor substrate;
   forming a lower electrode made of polycrystalline silicon with an uneven surface part in an inner wall of said opening part;
   forming a chemical oxide film by oxidizing a surface of said lower electrode having said uneven surface part by using an oxidize solution;
   modifying said chemical oxide film into a silicon oxynitride film by nitriding the surface of said uneven surface part of said lower electrode through said chemical oxide film;
   forming a capacitive insulating film made of a metal oxide film on said silicon oxynitride film; and forming an upper electrode on said capacitive insulating film.

2. The capacitor manufacturing method according to claim 1, wherein, in said step of forming said chemical oxide film, said uneven surface part of said lower electrode is cleaned for exposing a silicon clean surface of said uneven surface part and, subsequently, a wet treatment is performed by a chemical liquid with an oxidizing effect as said oxidize solution.

3. The capacitor manufacturing method according to claim 1, wherein, in said step of forming said upper electrode, a titanium nitride film is formed as said upper electrode at depositing temperatures of 650° C.-700° C.

4. The capacitor manufacturing method according to claim 1, wherein hydrogen peroxide water, ozone water, or nitrate water is used as said oxidize solution.

5. The capacitor manufacturing method according to claim 1, wherein said step of forming said upper electrode is performed after applying a heat treatment on said capacitive insulating film in an oxidation atmosphere.

* * * * *